US006753676B1

United States Patent
Myer

(12) United States Patent
(10) Patent No.: US 6,753,676 B1
(45) Date of Patent: Jun. 22, 2004

(54) RF TEST PROBE

(75) Inventor: Robert Evan Myer, Denville, NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/656,933

(22) Filed: Sep. 7, 2000

(51) Int. Cl.[7] .............................................. G01R 27/26
(52) U.S. Cl. ..................... 324/95; 324/158.1; 324/149; 324/690
(58) Field of Search ................ 324/754, 158.1, 324/765, 600, 690, 149, 752, 753, 761, 95, 106, 72.5, 633, 119; 439/482, 700, 72.5, 66; 340/600; 343/703

(56) References Cited

U.S. PATENT DOCUMENTS

| 3,794,914 A | * | 2/1974 | Aslan ........................... 324/95 |
| 3,919,638 A | * | 11/1975 | Belden, Jr. .................... 324/95 |
| 3,931,573 A | * | 1/1976 | Hopfer ........................ 324/106 |
| 4,392,108 A | * | 7/1983 | Hopfer .......................... 324/95 |
| 5,132,607 A |   | 7/1992 | Shah et al. ................. 324/72.5 |
| 5,274,336 A | * | 12/1993 | Crook et al. ................. 324/690 |
| 5,703,928 A | * | 12/1997 | Galloway et al. ............. 379/21 |
| 5,748,002 A | * | 5/1998 | Scott et al. .................. 324/633 |
| 5,834,931 A |   | 11/1998 | Moore et al. .................. 324/95 |
| 5,952,820 A | * | 9/1999 | Thrasher et al. ............ 324/119 |

FOREIGN PATENT DOCUMENTS

| EP | 0 534 826 | 3/1993 | ............. H01P/5/08 |
| EP | 0 551 564 A2 | 7/1993 | ........... G01R/1/067 |

OTHER PUBLICATIONS

Patent Abstracats of Japan, vol. 4, No. 142, Oct. 7, 1980, & JP 55 090861 A (FUJITSU), Jul. 9, 1980 * abstract *.
European Patent Office—Search Report.

* cited by examiner

Primary Examiner—Evan Pert
Assistant Examiner—Jimmy Nguyen

(57) ABSTRACT

An inexpensive RF test probe provides consistent monitoring of an RF signal while having minimal effect on the circuit under test. In one embodiment, an RF test probe comprises a return conductor and a probing conductor. The probing conductor is positioned within an insulator and a termination such as a 50 ohm resistor is electrically positioned between the ground conductor and probing conductor. The probe is used by placing a portion of the insulating material surrounding the probe conductor in contact with a circuit such as an RF microstrip carrying an RF signal to be monitored.

20 Claims, 2 Drawing Sheets

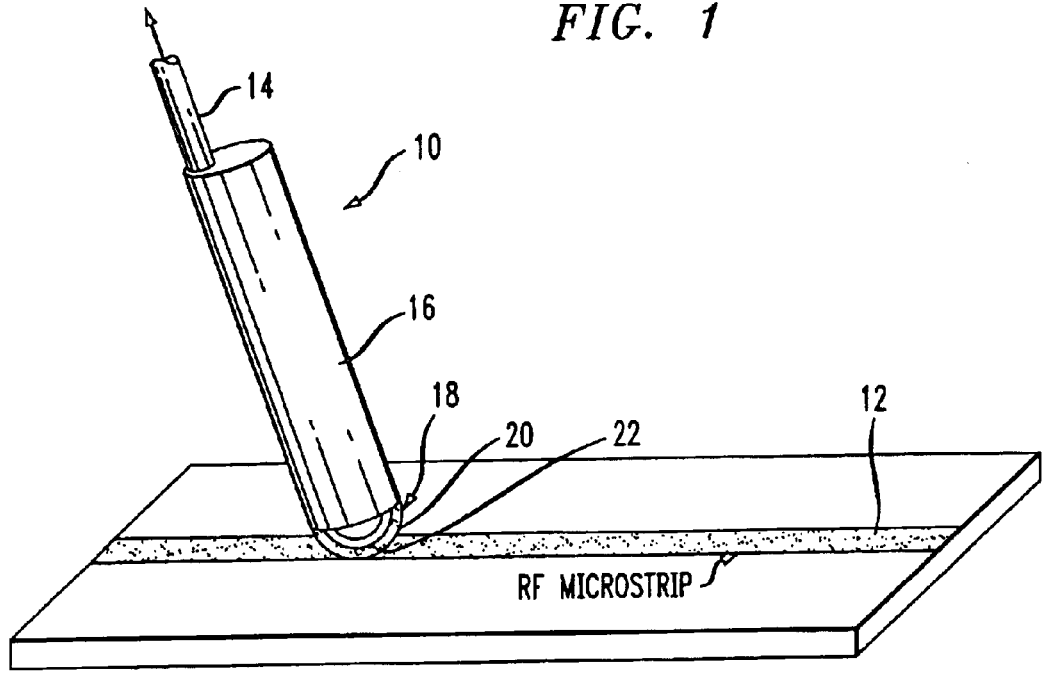
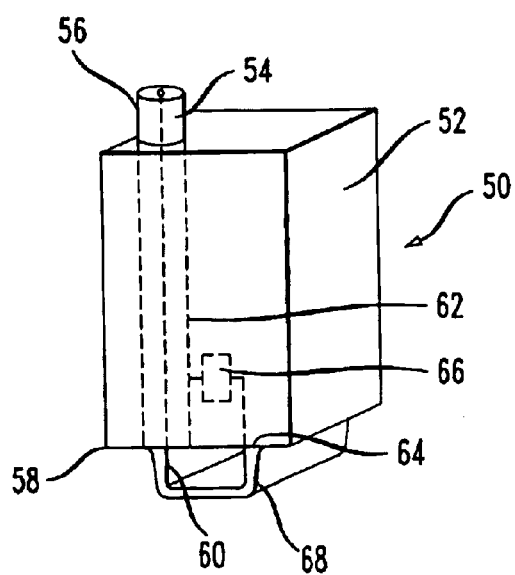

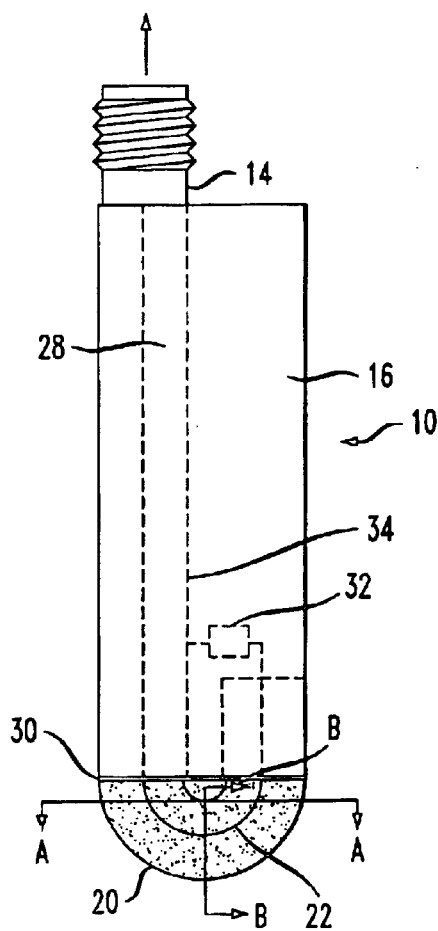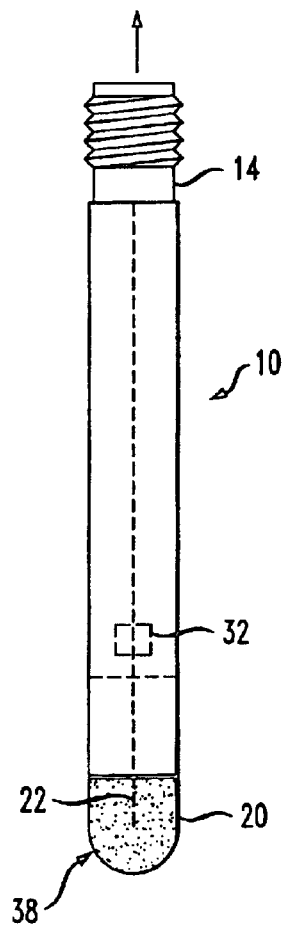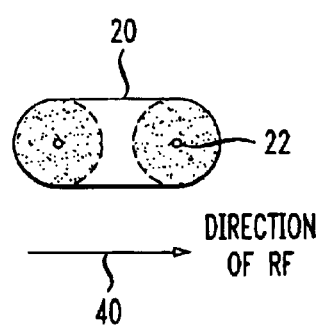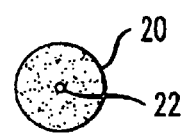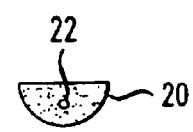

RF TEST PROBE

BACKGROUND OF THE INVENTION

1. Field of the Invention

The present invention relates to radio frequency circuits; more specifically, probes for testing radio frequency circuits.

2. Description of the Related Art

In the past, radio frequency circuits were tested usually using radio frequency (RF) couplers. Radio frequency couplers were built into the circuit to provide test points to monitor the radio frequency signal in the circuit under test. This technique had the disadvantage of using precious circuit card real estate as well as adding the expense of RF couplers.

Another technique for testing RF circuits involved using RF test probes with a bayonet type tip. One of the bayonet tips was used as a ground and the second bayonet tip was used to contact a radio frequency conductor such as a microstrip in the circuit under test. The bayonet tips often provided poor contact with either the microstrip or ground. Additionally, the bayonet probe affected the circuit under test and thereby distorted the RF signal to be measured.

SUMMARY OF THE INVENTION

The present invention provides an inexpensive RF test probe that provides a consistent measurement of an RF signal while having minimal effect on the circuit under test. In one embodiment of the present invention, an RF test probe comprises a return conductor and a probing conductor. The probing conductor is positioned within an insulator, and a termination such as a 50 ohm resistor is electrically positioned between the ground conductor and probing conductor. The probe is used by placing a portion of the insulating material that surrounds the probe conductor in contact with a circuit such as an RF microstrip carrying an RF signal to be monitored.

BRIEF DESCRIPTION OF THE DRAWINGS

FIG. 1 illustrates the RF test probe being used to measure an RF signal carried on an RF microstrip;

FIG. 2 is a side view of the RF test probe;

FIG. 3 is a second side view of the RF test probe;

FIG. 4 is a cross section along line AA of FIG. 2;

FIG. 5 is a cross section along line BB of FIG. 2;

FIG. 6 illustrates an alternative cross section taken along line BB of FIG. 2; and FIG. 7 illustrates another embodiment of the RF test probe.

DETAILED DESCRIPTION OF THE INVENTION

FIG. 1 illustrates RF test probe 10 being used to measure an RF signal carried on RF microstrip 12. Coaxial output portion 14 of RF test probe 10 carries a signal representative of the RF signal on microstrip 12 to testing equipment such as an oscilloscope or spectrum analyzer. Handle 16 is used to provide a convenient non-conductive gripping surface for the user. Signal pickup section 18 includes insulator 20 and probe conductor 22. The probe is used by contacting an outer surface of insulator 20 to the conductor carrying the RF signal to be monitored.

FIG. 2 is a side view of test probe 10. In this view, coaxial output portion 14 is shown with a threaded connector to facilitate connecting a cable used to provide a connection to testing equipment. Within handle 16, coaxial conductor 28 continues until reaching handle end 30. At handle end 30, the conductive shielding associated with the outer layer of coaxial conductor 28 is stripped away to expose a flexible insulator 20. It is possible to use the core material of the coaxial conductor as insulator 20; however, it is also possible to strip away the core material and use a flexible insulator such as a TEFLON® type material as insulator 20. (TEFLON® is a registered trademark of E. I. duPont de Nemours and Company.) Probe conductor 22, which may be the center conductor of coaxial conductor 28, continues on a curved path through insulator 20 and reenters handle 16. Once reentering handle 16, probe conductor 22 is terminated in terminator 32. Terminator 32 is electrically positioned between probe conductor 22 and the return or ground conductor of coaxial conductor 28. The return conductor of coaxial conductor 28 may be external metal sheathing 34 or may be a conductive shield positioned below a non-conductive outer shield. Terminator 32 may be a resistor or semiconductive device such as a diode. If a resistor is used, it is preferable to use a resistance value that matches the characteristic impedance of the RF circuit under test. In many circuits, the characteristic impedance is typically 50 ohms and therefore terminator 32 is typically a 50 ohm resistor.

FIG. 3 illustrates another side view of test probe 10. The view of FIG. 3 illustrates the view of FIG. 2 rotated 90 degrees.

FIG. 4 is a cross section taken along line AA of FIG. 2. The cross section illustrates conductor 22 within insulator 20 and it also illustrates that insulator 20 has a circular cross section. Additionally, arrow 40 illustrates the direction of the RF signal in the circuit under test relative to the probe to produce the maximum signal conducted through coaxial conductor 28. As a result, the probe may be rotated to determine the propagation direction of the RF signal being monitored.

FIG. 5 is a cross section taken along line BB of FIG. 2. FIG. 5 once again illustrates that the cross section of insulator 20 is circular. The circular cross section offers the advantage of allowing the probe to be held at different angles when making contact with a conductor carrying an RF signal to be monitored. The circular cross section permits the probe to be held at different angles while maintaining the same distance between probe conductor 22 and the conductor carrying the signal to be monitored. This results in consistent measures of the signal to be monitored independent of the angle at which the probe is held.

FIG. 6 illustrates an alternative cross section taken along line BB of FIG. 2. In this case, insulator 20 has at least a partial cross section that is substantially circular in a plane that is substantially perpendicular to probe conductor 22 that is passing through the cross section. This embodiment offers the advantage of providing a circular cross section along the areas where the probe would most likely contact the circuit under test while providing a flat cross section in areas where the probe is less likely to contact a circuit carrying a signal to be monitored.

FIG. 7 illustrates an alternative embodiment to the invention. In this embodiment, probe 50 includes handle 52 and coaxial conductor 54. Coaxial conductor 54 may include a threaded end at end section 56 to facilitate connection to a coaxial cable for connection to testing equipment. At end 58 of handle 52 probe conductor 60, which may be the center conductor of coaxial conductor 54, emerges from the handle without outer conductive shield 62 of coaxial conductor 54. It should be noted that outer shield 62 may also act as a return or ground conductor. Probe conductor 60 extends out from handle 52 and then returns into handle 52 at position 64. After reentering handle 64, conductor 60 is terminated in terminator 66 which is electrically positioned between conductor 60 and return conductor 62. As mentioned earlier, terminator 66 may be a resistor or semiconductor device such as a diode. Insulator 68 is positioned adjacent to the portion of probe conductor 60 that extends out of handle 52. The outer surface of insulator 68 is used to make contact to a conductor carrying an RF signal to be monitored. Insulator 68 may be attached directly to conductor 60 or it may be held in a spaced relationship to conductor 60 and attached to handle 52 for mechanical support.

Other embodiments of the invention may include configurations that permit an insulated surface adjacent to a probing conductor to be placed in contact with an RF circuit under test while a terminator is placed between the probe conductor and a return or ground conductor.

What is claimed is:

1. An RF probe, comprising:
   a conductive return;
   an insulator having a contact surface;
   a probe conductor adjacent to the insulator; and
   a termination electrically positioned between the conductive return and the probe conductor, wherein the probe conductor is equidistant with the insulator along the entire contact surface.

2. The RF probe of claim 1, wherein the conductive return is a ground return.

3. The RF probe of claim 1, wherein the termination is a resistor.

4. The RF probe of claim 3, wherein the probe conductor is formed within a coaxial conductor and the termination is approximately 50 ohms.

5. The RF probe of claim 1, wherein the termination is a semiconductor device.

6. The RF probe of claim 5, wherein the termination is a diode.

7. An RF probe, comprising:
   a conductive return;
   a probe conductor within an insulator, the insulator having a contact surface; and
   a termination electrically positioned between the conductive return and the probe conductor, wherein the probe conductor is equidistant with the insulator along the entire contact surface.

8. The RF probe of claim 7, wherein the conductive return is a ground return.

9. The RF probe of claim 7, wherein the termination is a resistor.

10. The RF probe of claim 9, wherein the probe conductor is formed within a coaxial conductor and the termination is approximately 50 ohms.

11. The RF probe of claim 7, wherein the termination is a semiconductor device.

12. The RF probe of claim 11, wherein the termination is a diode.

13. The RF probe of claim 7, wherein the insulator has at least a partial cross section that is substantially circular in a plane substantially perpendicular to the probe conductor.

14. The RF probe of claim 13, wherein the conductive return is a ground return.

15. The RF probe of claim 13, wherein the termination is a resistor.

16. The RF probe of claim 15, wherein the termination is approximately 50 ohms.

17. The RF probe of claim 13, wherein the termination is a semiconductor device.

18. The RF probe of claim 17, wherein the termination is a diode.

19. An RF probe, comprising:
   a conductive return;
   a probe conductor positioned within an insulator having a contact surface, the probe conductor being curved and the insulator having at least a partial cross section that is substantially circular in a plane substantially perpendicular to the probe conductor; and
   a termination electrically positioned between the conductive return and the probe conductor, wherein the probe conductor is equidistant with the insulator along the entire contact surface.

20. The RF probe of claim 19, wherein the probe conductor is equidistant with an RF source along the contact surface.

* * * * *